(12) United States Patent
Carpenter

(10) Patent No.: US 10,644,583 B2
(45) Date of Patent: May 5, 2020

(54) METHODS, APPARATUS, AND SYSTEM TO PROVIDE A HIGH-EFFICIENCY DRIVE FOR A FLOATING POWER DEVICE

(71) Applicant: Texas Instruments Incorporated, Dallas, TX (US)

(72) Inventor: Brian Ashley Carpenter, Cary, NC (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 16/002,756

(22) Filed: Jun. 7, 2018

(65) Prior Publication Data

US 2019/0379272 A1   Dec. 12, 2019

(51) Int. Cl.
*H02M 1/088* (2006.01)
*H02M 3/07* (2006.01)
*H02M 1/00* (2006.01)

(52) U.S. Cl.
CPC ............ *H02M 1/088* (2013.01); *H02M 3/07* (2013.01); *H02M 2001/0048* (2013.01)

(58) Field of Classification Search
CPC . H02M 1/088; H02M 3/07; H02M 2001/0048
See application file for complete search history.

(56) References Cited

U.S. PATENT DOCUMENTS

| | | | | |
|---|---|---|---|---|
| 9,680,377 B2* | 6/2017 | Zhang | ..................... | H02M 1/08 |
| 2006/0186922 A1* | 8/2006 | Rozsypal | ............. | H03K 17/063 |
| | | | | 326/63 |
| 2006/0244534 A1* | 11/2006 | Whittaker | ............. | H03F 1/0211 |
| | | | | 330/285 |
| 2010/0231187 A1* | 9/2010 | Wicht | ................... | H02M 3/156 |
| | | | | 323/282 |
| 2011/0089997 A1* | 4/2011 | Tonomura | ............... | H02M 3/07 |
| | | | | 327/536 |
| 2014/0152282 A1* | 6/2014 | Hosokawa | .......... | H02M 3/1588 |
| | | | | 323/282 |
| 2019/0028024 A1* | 1/2019 | Rana | | |
| 2019/0081549 A1* | 3/2019 | Lee et al. | | |

OTHER PUBLICATIONS

Ye et al., "Design and Implementation of a Low-cost and Compact Floating Gate Drive Power Circuit for GaN-based Flying Capacitor Multi-Level Converters," Department of Electrical and Computer Engineering, University of Illinois at Urbana-Champaign, May 17, 2017, 10 pages.

* cited by examiner

*Primary Examiner* — Adolf D Berhane
*Assistant Examiner* — Kevin H Sprenger
(74) *Attorney, Agent, or Firm* — Tuenlap Chan; Charles A. Brill; Frank D. Cimino

(57) ABSTRACT

Methods and apparatus to provide a high-efficiency drive for a floating gate are disclosed. An example apparatus includes a driver including a supply terminal, the driver configured to output a third voltage corresponding to the supply terminal, the driver to drive a gate of a transistor in a power converter; and a second capacitor to be charged using a first discharging current of a first capacitor and discharged at the supply terminal of the driver, the driver to drive the gate of the transistor based on a second discharging current from the second capacitor.

19 Claims, 4 Drawing Sheets

US 10,644,583 B2

METHODS, APPARATUS, AND SYSTEM TO PROVIDE A HIGH-EFFICIENCY DRIVE FOR A FLOATING POWER DEVICE

FIELD OF THE DISCLOSURE

This disclosure relates generally to power converters and, more particularly, to methods, apparatus, and system to provide a high-efficiency drive for a floating power device.

BACKGROUND

A power converter is a circuit that is used in various electrical systems to convert an input voltage to a desired output voltage. For example, a buck converter converts an input voltage into a lower output voltage by controlling transistors and/or switches to charge and/or discharge inductors and/or capacitors to maintain the desired output voltage. A flying capacitor multi-level (FCML) buck converter is a type of direct current (DC) to direct current (DC-DC) converter that achieves high power density and high-efficiency. Such FCML converters have increased in popularity with respect to power electronic applications.

SUMMARY

Certain examples disclosed herein provide a high-efficiency drive for a floating power device in power converters. An example apparatus includes a driver including a supply terminal, the driver configured to output a third voltage corresponding to the supply terminal, the driver to drive a gate of a transistor in a power converter; and a second capacitor to be charged using a first discharging current of a first capacitor and discharged at the supply terminal of the driver, the driver to drive the gate of the transistor based on a second discharging current from the second capacitor.

Certain examples disclosed herein provide a high-efficiency drive for a floating power device. An example apparatus includes a first driver coupled to ground; a first capacitor including a first terminal coupled to an output of the first driver; a first switch coupled to a second terminal of the first capacitor and a second switch at a first node; a second capacitor including a third terminal coupled to the first switch at a second node; and a second driver including a supply input coupled to the first switch and the third terminal second capacitor at the second node.

Certain examples disclosed herein provide a high-efficiency drive for a floating power device. An example system includes a power converter including a first high-side transistor and a second high-side transistor, the first high-side transistor not being coupled to ground; and a gate driver to control the first high-side transistor, the gate driver including: a first capacitor coupled to a second source of the second high-side transistor via a first switch; a second capacitor including a first terminal coupled to a first source of the first high-side transistor and a second terminal coupled to the first capacitor via a voltage clamp and a second switch; and a driver including a supply terminal coupled to the second terminal of the second capacitor and the voltage clamp, the driver to enable the first high-side transistor using a discharge current of the second capacitor based on a control signal.

BRIEF DESCRIPTION OF THE DRAWINGS

The figures are not to scale. Wherever possible, the same reference numbers will be used throughout the drawing(s) and accompanying written description to refer to the same or like parts.

DETAILED DESCRIPTION

Figure 1:
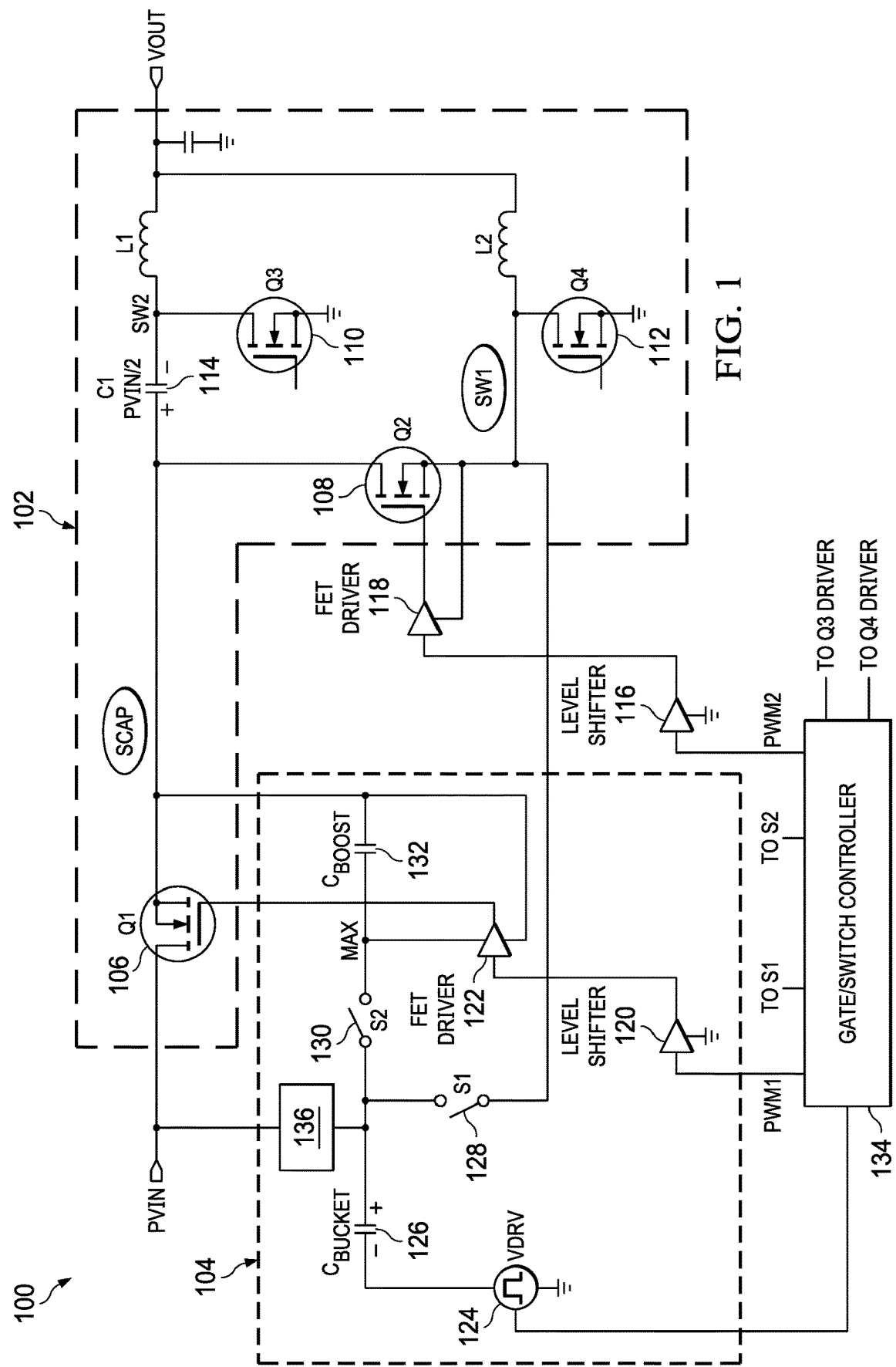
FIG. 1 is an example system including an example power converter and an example floating gate driver.

A flying capacitor multi-level (FCML) converter is a type of DC/DC converter that includes switches (e.g., MOSFETs) to converter an input voltage to a desired output voltage. A MOSFET can act as a switch when the gate to source voltage ($V_{GS}$) is higher than the threshold voltage (VTH) of the MOSFET. Accordingly, grounded MOSFETs (e.g., MOSFETS whose source is grounded) can be controlled by conventional drivers (e.g., drivers or bootstrap drivers) by applying a voltage (e.g., higher than VIE) to the gate of the MOSFET. However, in some power converters (e.g., FCML converters), the high-side MOSFET (e.g., the MOSFET that is enabled to increase the output voltage of the converter) is not ground referenced (e.g., due to the use of flying capacitors). For example, the voltage at the drain of the high-side MOSFET will be the input voltage and the voltage at the source of the high-side MOSFET will oscillate between the input voltage and a fraction of the input voltage depending on the number of levels (e.g., ½ the input voltage if the FCML converter is a 2-level converter, ⅓ the input voltage if the FCML converter is a 3-level converter, etc.). Accordingly, the gate of such MOSFETs cannot be driven by a conventional bootstrap driver because the source terminal of the MOSFET is never at ground potential during operation (e.g., floating). Examples disclosed herein provide a driver to drive a gate of a MOSFET whose source is not grounded (e.g., a high-efficiency floating gate driver to control floating MOSFETs in power converters). As used herein, a floating MOSFET is a MOSFET including a source that is never referenced to ground. Although examples disclosed herein are described in conjunction with a floating MOSFET in a power converter, examples disclosed herein may be used in conjunction with any type of switch (e.g., field effect transistors, Insulated gate bipolar transistors (IGBT), Gallium Nitride (GaN), Silicon Carbide (SiC), silicon-controlled rectifiers (SCRs), silicon, etc.).

One technique for driving a non-grounded MOSFET in a FCML converter includes a DC/DC converter to drive the gates of non-grounded MOSFETs. However, the DC/DC converter of such a technique is large and costly. Other techniques include a charge pump scheme including multiple linear regulators. However, such techniques also require a large amount of components and cost. Additionally, such techniques are only 36% efficient. Examples disclosed herein provide a high-efficiency floating gate driver for floating MOSFETs in power converters that includes fewer components than conventional techniques, thereby reducing cost and size, and is highly efficient. For example, examples disclosed herein provide a floating gate driver that is 70% to over 80% efficient.

An example driver for a floating MOSFET (e.g., a floating gate driver) disclosed herein includes a voltage driver, a level shifter, and a FET driver, two capacitors, and two switches. Examples disclosed herein leverage nodes of a power converter in combination with the voltage driver to provide a power supply for the floating FET driver. In this manner, when the FET driver is to enable the high-side MOSFET (e.g., that is not grounded), the charge stored in one of the capacitors is used by FET driver to raise the $V_{GS}$ of the MOSFET beyond the threshold voltage to turn it ON regardless of what the source voltage of the MOSFET is. Using examples disclosed herein, the only loss of efficiency is seen at the voltage loss of the two switches, thereby corresponding to 70% to over 80% efficiency.

FIG. 1 illustrates an example system 100 including an example two-level flying capacitor buck converter (FCBC) 102, an example floating gate driver 104, example MOSFETs (Q1-Q4) 106, 108, 110, 112, an example capacitor (C1) 114, an example level shifters 116, 120 example FET drivers 118, 122, an example voltage driver 124, an example bucket capacitor ($C_{BUCKET}$) 126, example switches (S1, S2) 128, 130, an example boost capacitor ($C_{BOOST}$) 132, an example gate/switch controller 134, and an example precharger circuit 136. In FIG. 1, the example MOSFETs 106, 108, 110, 112 are power FETs (e.g., Gallium Nitride (GaN) FETs.). However, the example MOSFETs 106, 108, 110, 112 may be any types of switches (e.g., field effect transistors, SCRs, SiC, silicon, IGBTs, etc.). In FIG. 1, the example capacitor (C1) 114 is a flying capacitor due to its location within the system 100. The gate drives for ground referenced switches 110 and 112 are omitted for clarity. Although the example floating gate driver 104 drives the un-grounded gate of the example MOSFET Q1 106 of the example two-level flying capacitor buck converter 102, the example floating gate driver 104 may drive any un-grounded gate of any type of power converter with any number of levels, as described below in conjunction with FIG. 4.

Figure 2:
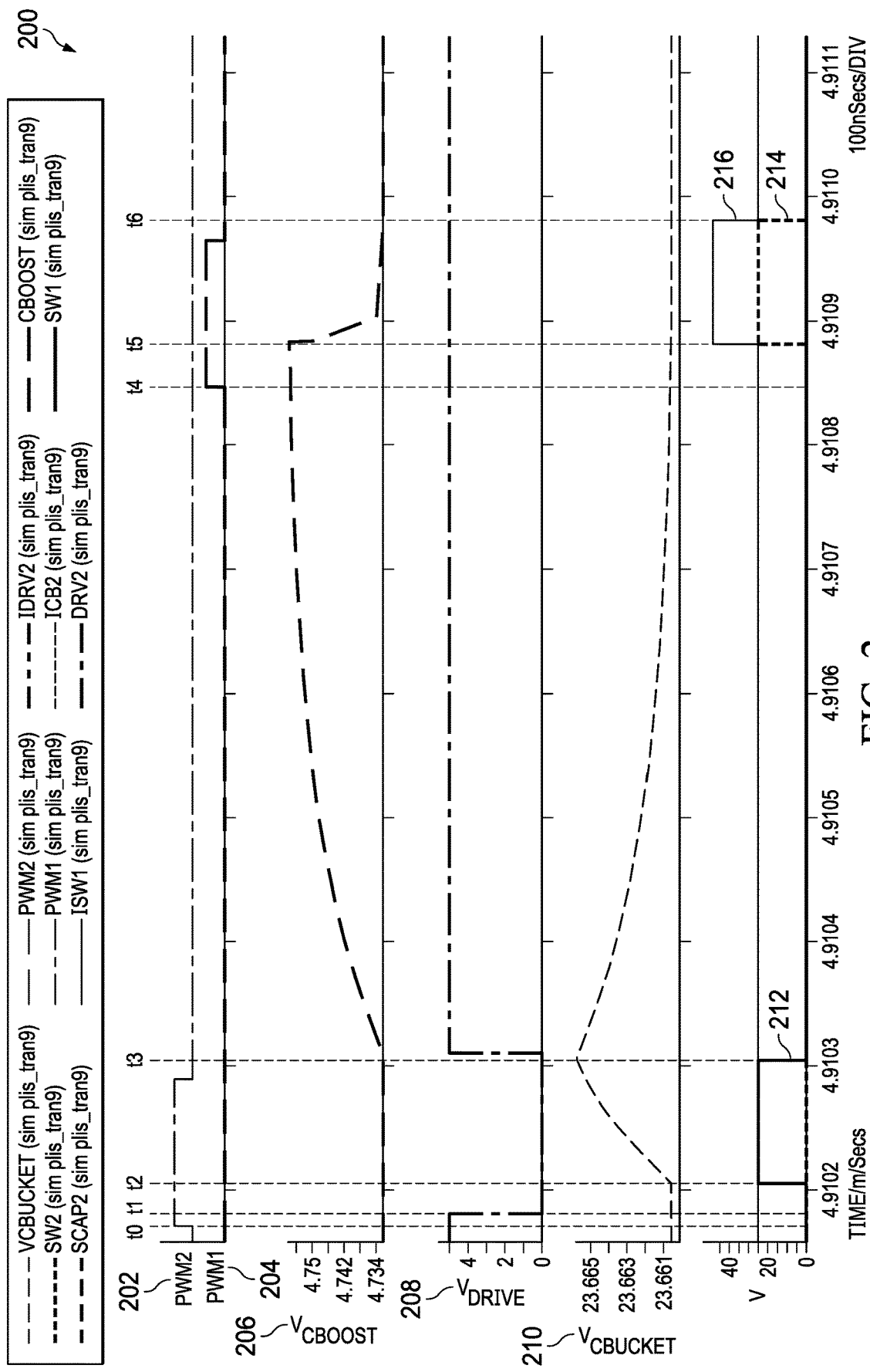
FIG. 2 is a timing diagram corresponding to control of the example power converter of FIG. 1.

The example two-level flying capacitor buck converter 102 of FIG. 2 receives an input voltage (PVIN) and converts the PVIN to a desired output voltage ($V_{OUT}$) based on the control of the example high-side MOSFETS Q1, Q2 106, 108 and the example low-side MOSFETS Q3, Q4 110, 112. For example, during a first time interval, the example MOSFET Q1 106 may be enabled (e.g., turned on) and MOSFETs 108, 110 are disabled (e.g., turned off) to allow inductor current through the first inductor L1 to increase and the example flying capacitor 114 to charge. Additionally, during the first time interval, the example MOSFET Q4 112 is enabled to decrease the inductor current through L2. During the first time interval, the voltage across the flying capacitor 114 is half of the input voltage. However, as described above, the voltage across the flying capacitor 114 is a function of the number of level of the converter 102. The example timing diagram 300 of FIG. 3 further describes the timing protocol for enabling the example MOSFET Q1 106 during the first time interval.

During a second and fourth-time interval, the example MOSFETs 110, 112 are enabled and the example MOSFETs 106, 108 are disabled, thereby grounding the switching nodes SW1 and SW2 and decreasing both inductor currents. Because there is no current in the example flying capacitor 114, the voltage remains constant.

During a third-time interval, the example MOSFETs 106, 112 are disabled and the example MOSFETS 108, 110 are enabled. Because the example MOSFET Q3 110 is enabled, the negative side of the flying capacitor 114 is coupled to ground. The example flying capacitor 114 acts as an input capacitor to the second level (e.g., the second inductor L2) and brings the SW2 node up to half of PVIN. In operation, the example gate/switch controller 134 triggers the enabling and disabling of the example MOSFETs 106, 108, 110, 110 according to a repeated pattern of intervals first through fourth time intervals by transmitting pulses to the respective drivers. For example, to enable the example MOSFET Q2 108, the example gate/switch controller 134 outputs a voltage pulse to the example level shifter 116, which translates the signal from a first logic level to another to enable the example FET driver 118 to output a voltage to the gate of the example MOSFET Q2 108 sufficiently high to enable the example MOSFET Q2 108. The example gate/switch controller 134 is further described below.

The example floating gate driver 104 of FIG. 1 drives the example MOSFET Q1 106. As described above, the driver 104 includes additional components to provide sufficient voltage to drive the gate of the example MOSFET Q1 106 even though the source of the MOSFET Q1 106 is never grounded. The driver 104 includes the example level shifter 120 and the example FET driver 122. The example level shifter 120 translates the signal (e.g., from the example gate/switch controller 134) from a first logic level to another to enable the example FET driver 122. The example FET driver 122 receives the output of the level shifter 120 and outputs a voltage based on a voltage at the supply terminals of the example FET driver 122. The positive supply terminal receives a voltage from the max node and the negative supply terminal receives a voltage from the SCAP node. In this manner, the maximum voltage that the example driver 122 can output correspond to the voltage at the max node and the minimum voltage that the example driver 122 can output corresponds to the voltage at the SCAP mode. For example, if the level shifter 120 outputs a low voltage, the example FET driver 122 will output the voltage at the negative supply terminal (e.g., corresponding to the SCAP node) and, if the level shifter 120 outputs a high voltage, the example FET driver 122 will output the voltage at the positive supply terminal (e.g., corresponding to the voltage at the MAX node).

The example floating gate driver 104 of FIG. 1 includes the example voltage driver 124 to output two voltages. For example, the voltage driver 124 may output a preset voltage (e.g., 5 Volts (V)) or a low voltage (e.g., ground). When the voltage driver 124 drops from the preset voltage output to a low voltage output, the voltage differential across the example $C_{BUCKET}$ 126 increases, thereby charging the example $C_{BUCKET}$ 126. The example floating gate driver 104 may be controlled based on instructions from the example gate/switch controller 134. For example, the gate/switch controller 134 may output a high level control signal to instruct the example voltage driver 124 to output the preset voltage and output a low level control signal to instruct the example voltage driver 124 to output the low voltage.

The example $C_{BUCKET}$ 126 and the example $C_{BOOST}$ 132 of FIG. 1 store charge based on a voltage differential between the anode and the cathode of the respective capacitors 126, 132. The example $C_{BUCKET}$ 126 and the example $C_{BOOST}$ 132 discharges the stored charge when the voltage differential of the respective capacitors 126, 132 decreases.

The example switches (S1, S2) 128, 130 of FIG. 2 may be enabled and/or disabled (e.g., turned on or off) to create and open circuit or a closed circuit. The example switches 128, 130 may be switches, MOSFETs, and/or diodes. When the example switches 128, 130 are diodes, the switches 128, 130 are automatically enabled when current flows through them in a particular direction (e.g., the switches 128, 130 do not require a trigger from the example gate/switch controller 134 to open or close). For example, when current flows from the SCAP node toward the example $C_{BUCKET}$ 126, the example switch S1 128 turns on (e.g., closes) and when current flows from the example $C_{BUCKET}$ 126 toward the example $C_{BOOST}$ 132, the example switch S2 130 turns on (e.g., closes). When the example switches 128, 130 may are switches or MOSFETs, the switches 128, 130 require a control signal to enable and/or disable the example switches 128, 130. The type of switch used effects the overall efficiency, space, and/or cost of the floating gate driver 104. The type of switch used may be different based on user and/or manufacturer preferences.

The example gate/switch controller 134 of FIG. 1 transmits control signals to one or more of the example drivers 120, 122, 124 and/or the example switches 128, 130. The example gate/switch controller 134 transmits one or more signals to the example drivers 120, 122, 124 to increase and/or decrease the output voltage. The example gate/switch controller 134 transmits one or more signals to the example switches 128, 130 to enable and/or disable the example switches 128, 130. The example gate/switch controller 134 drives the example components 120, 122, 124, 128, 130 to ensure that the voltage applied to the gate of the example Q1 106 is sufficient to enable the example MOSFET Q1 106, regardless of the voltage at the source of the example MOSFET Q1 106. In some examples, the gate/switch controller 134 may include multiple controllers for the multiple output signals. For example, a first controller may be used to transmit control signals to the drivers of the gates of the example MOSFETs 106, 108, 110, 112 and a second controller may be used to transmit signals to the example voltage driver 124, the example switch S1 128, and/or the example switch S2 122. Although the example of FIG. 1 includes the example gate/switch controller 134 of FIG. 1, in some examples the gate/switch controller may implement, or be replaced by, a pulse width modulation (PWM) generator to output a first and second signal in accordance with the timing described herein. In this manner, the switches 122, 128 and/or drivers 116, 120, 124 (e.g., drivers for the example transistors 110, 112) may be controlled using one or more preprogrammed PWM signals. In some examples (e.g., such as in multi-phase systems), the gate/switch controller 134 may be replaced with a driverless controller (e.g., discrete driver and FETs or an integrated driver and FETs implementing a power stage). Additionally or alternatively, the example gate/switch controller 134 and/or the example drivers 116, 120, 124 may include additional or alternative structures to enable high efficiency driver for a floating gate device. Additionally, when the example switches S1, S2 122, 128 are implemented by diodes, the example/switch controller 134 does not control the example switches 122, 128.

In operation, the example floating gate driver 104 of FIG. 1 drives the example MOSFET Q1 106 by ensuring that the FET driver 122 has enough voltage to enable the gate of the ungrounded MOSFET Q1 106 regardless of the source voltage at the SCAP node. Initially, the example flying capacitor 114 is pre-charged to PVIN/2. To ensure that the FET driver 122 has enough voltage to enable to gate of the example MOSFET Q1 106, the example gate/switch controller 134 generates a first voltage pulse corresponding to a logic level signal to the example level shifter 116 to enable the example MOSFET Q2 108 (e.g., via the example FET driver 118). Additionally, the example gate/switch controller 134 instructs the example voltage driver 124 to drop to a low voltage. Because the example MOSFET Q2 108 is enabled, the voltage at the SCAP node (e.g., PVIN/2) is the same as the voltage at the SW1 node (e.g., the enabled MOSFET Q2 108 generates a short between SCAP and SW1). Additionally, the example switch S1 128 closes (e.g., because current is flowing from the example SW1 node to the example $C_{BUCKET}$ 126 (e.g., when the switch S1 128 is a diode and/or because the example gate/switch controller 134 enables the example switch S1 128). Accordingly, the voltage differential across the example $C_{BUCKET}$ 126 causes the $C_{BUCKET}$ 126 to charge. In some examples, the $C_{BUCKET}$ 126 is charged using RC time constraints of the circuit to work with a range of timing expected of the circuit. For example, the resistances of the example switches 128, 130 and/or the example voltage driver 124 need to be low enough to charge the example $C_{BUCKET}$ 126 and the example $C_{BOOST}$ 132 to the voltage at SCAP and the voltage at SCAP plus the voltage driver voltage with minimal error. In some examples, the $C_{BUCKET}$ 126 may be charged based on a real-time feedback of the capacitor voltage to determine when the $C_{BUCKET}$ 126 is sufficiently charged.

After the $C_{BUCKET}$ 126 of FIG. 1 has been charged (e.g., based on the duration of the high voltages applied to the example MOSFET Q2 108, the example switch S1 128, and/or the example voltage driver 124), the example gate/switch controller 134 instructs the example voltage driver 124 to increase its output voltage (e.g., to 5-7 V) and the example level shifter 116 to disable the example MOSFET Q2 108 via the example FET driver 118. Additionally, the example gate/switch controller 134 disables the S1 128 and enables the example switch S2 130 (e.g., if implemented by voltage controlled switches). In some examples, when the switches 128, 130 are the diodes, the example switch S1 128 automatically disables and the example switch S2 130 automatically enables based on the current flow. Accordingly, the extra charge stored in the example $C_{BUCKET}$ 126 is discharged toward the example $C_{BOOST}$ 132 through the example switch S2 130, thereby charging the example $C_{BOOST}$ 132 toward the voltage at the SCAP node+the voltage output by the example voltage driver 124 (e.g., corresponding to the excess charge stored in the example $C_{BUCKET}$ 126 during the previous operation).

When the $C_{BOOST}$ 132 of FIG. 1 is sufficiently charged (e.g., the voltage at the node between S2 130 and the example $C_{BOOST}$ 132 corresponds to the sum of the voltage at the SCAP node and the output of the voltage driver 124), the example gate/switch controller 134 pulses the voltage applied to the example level shifter 120, thereby causing the example level shifter 120 to output a high voltage to the example FET driver 122. In response to receiving the high voltage, the example FET driver 122 outputs a high voltage based on the voltage at the MAX node (e.g., PVIN/2+the voltage of the voltage driver 124). The example $C_{BOOST}$ 132 provides the operating voltage for the FET driver 122. In this manner, when the output of the example FET driver 122 is driven high, the current from the example $C_{BOOST}$ 132 charges the gate of the example MOSFET Q1 106. Because the capacitance of $C_{BOOST}$ 132 is much greater than the gate-source of the example MOSFET Q1 106, the $C_{BOOST}$ 132 discharges a small amount of voltage. The charge is restored when the example MOSFET Q1 106 is OFF (e.g., via operation of the example voltage driver 124, S1 128, $C_{BUCKET}$ 126, and S2 130 before the example MOSFET Q1 106 is driven high again).

The example pre-charger circuit 136 of FIG. 1 precharges the $C_{BOOST}$ 132 at startup and/or during a reset. In this manner, the example $C_{BOOST}$ 132 is sufficient charged to operate based on the examples disclosed herein. In some examples, the pre-charger circuit 136 is a linear regulator that provides current to charge the example $C_{BOOST}$ 132. In some examples, the pre-charger circuit 136 is a clock source gated with the PWM to drive the voltage driver 124 before the PWM is active. Additionally or alternatively, there may be other ways for the example pre-charger circuit 136 to pre-charge the example $C_{BOOST}$ 132. Once the $C_{BOOST}$ 132 is charged, the pre-charger circuit 136 may be decoupled from the circuit, as it is no longer needed (e.g., until a subsequent start up or reset).

While an example manner of implementing the example floating gate driver 104 and/or the example gate/switch controller 132 of FIG. 1 is illustrated in FIG. 1, one or more of the elements, processes and/or devices illustrated in FIG. 1 may be combined, divided, re-arranged, omitted, eliminated and/or implemented in any other way. Further, the example drivers 120, 122, 124, the example capacitors 126, 132, the example switches 128, 130, and/or, more generally, the example floating gate driver 104 and/or the example gate/switch controller 134 of FIG. 1 may be implemented by hardware, software, firmware and/or any combination of hardware, software and/or firmware. Thus, for example, any of the example drivers 120, 122, 124, the example capacitors 126, 132, the example switches 128, 130, and/or, more generally, the example floating gate driver 104 and/or the example gate/switch controller 134 of FIG. 1 could be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example drivers 120, 122, 124, the example capacitors 126, 132, the example switches 128, 130, and/or, more generally, the example floating gate driver 104 and/or the example gate/switch controller 134 of FIG. 1 is/are hereby expressly defined to include a non-transitory computer readable storage device or storage disk such as a memory, a digital versatile disk (DVD), a compact disk (CD), a Blu-ray disk, etc. including the software and/or firmware. Further still, the example floating gate driver 104 and/or the example gate/switch controller 134 of FIG. 1 may include one or more elements, processes and/or devices in addition to, or instead of, those illustrated in FIG. 1, and/or may include more than one of any or all of the illustrated elements, processes and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, and (6) B with C.

FIG. 2 is an example timing diagram 200 corresponding to the voltage at various points in the system 100 of FIG. 1 to provide floating device control of the example MOSFET Q1 106 of FIG. 1. The example timing diagram 200 includes an example PWM2 voltage 202 (e.g., corresponding to voltage input into the example level shifter 116), an example PWM1 voltage 204 (e.g., corresponding to the voltage input into the example level shifter 120), an example $C_{BOOST}$ voltage ($V_{BOOST}$) 206 (e.g., corresponding to the voltage across the example $C_{BOOST}$ 132), an example voltage driver voltage ($V_{DRIVE}$) 208 (E.g., corresponding to the voltage output by the example voltage driver 124), an example $C_{BUCKET}$ voltage ($V_{CBUCKET}$) 210 (e.g., corresponding to the voltage across the example $C_{BUCKET}$ 126), an example SW1 node voltage 212, an example SW2 node voltage 214, and an example SCAP node voltage 216. The example node voltages 212, 214, 216 correspond to the nodes of respective nodes of FIG. 1. Although the example timing diagram 200 of FIG. 2 corresponds to the floating gate driver 104, the example gate/switch controller 134, and the example two-level FCBC 102 of FIG. 1, the timing diagram 200 may be used in conjunction with any type of floating gate driver, gate/switch controller, and/or any type of power converter.

At t0 of the example timing diagram 200 of FIG. 2, the example gate/switch controller 134 increases the example PWM2 voltage 202 applied to the example level shifter 116 to enable the example MOSFET Q2 108 via the example FET driver 118. At time t1, the example voltage driver 124 decreases the $V_{DRIVE}$ 208 from a preset voltage (e.g., 5 V) to a low voltage (e.g., 0 V). At time t2 (e.g., after the delay corresponding to the example level shifter 116 and the example FET driver 118), the voltage at the example SW1 voltage 212 increases to PVIN/2 (e.g., substantially the same as the example SCAP voltage 216). The SW1 voltage 212 increases to the PVIN/2 because the SCAP node is shorted to the SW1 node when the example MOSFET Q2 108 is enabled. Because the example SW1 voltage 212 increases to PVIN/2 and the example switch S1 128 is enabled (e.g., automatically if S1 128 is a diode or based on a control signal from the example gate/switch controller 134), the example $V_{CBUCKET}$ 210 increase from its pre-stored charge corresponding to an initial voltage to PVIN/2 (e.g., caused by the charging of the example $C_{BUCKET}$ 126).

Slightly before time t3, the example gate/switch controller 134 decreases the PWM2 voltage 202 to disable the example MOSFET Q2 108, thereby causing the example PWM2 voltage 202 to drop back to ground at time t2 (e.g., after some delay). Shortly after time t3, the example $V_{DRIVE}$ 208 increases back to the preset voltage (e.g., 5 V), thereby causing the example $V_{CBUCKET}$ 210 to decrease and the example $V_{CBOOST}$ 206 to increase as the example $C_{BUCKET}$ 126 discharges into the example $C_{BOOST}$ 132 to charge the example $C_{BOOST}$ 132).

At time t4, the example gate/switch controller 134 increase the example PWM1 voltage 204 to enable the example MOSFET Q1 106 (e.g., via the example level shifter 120 and the example FET driver 122). At time t5, the example $C_{BOOST}$ 132 discharges into the example FET driver 122, thereby decreasing the example $V_{CBOOST}$ 206 to cause the example MOSFET Q1 106 to enable. Enabling the example MOSFET Q1 106 cause the example SW node voltage 214 to increase to PVIN/2 and the example SCAP node voltage 216 increase to PVIN. Shortly before time t6, the example gate/switch controller 134 decreases the example PWM1 voltage 204 to disable the example MOSFET Q1 106.

Figure 3:
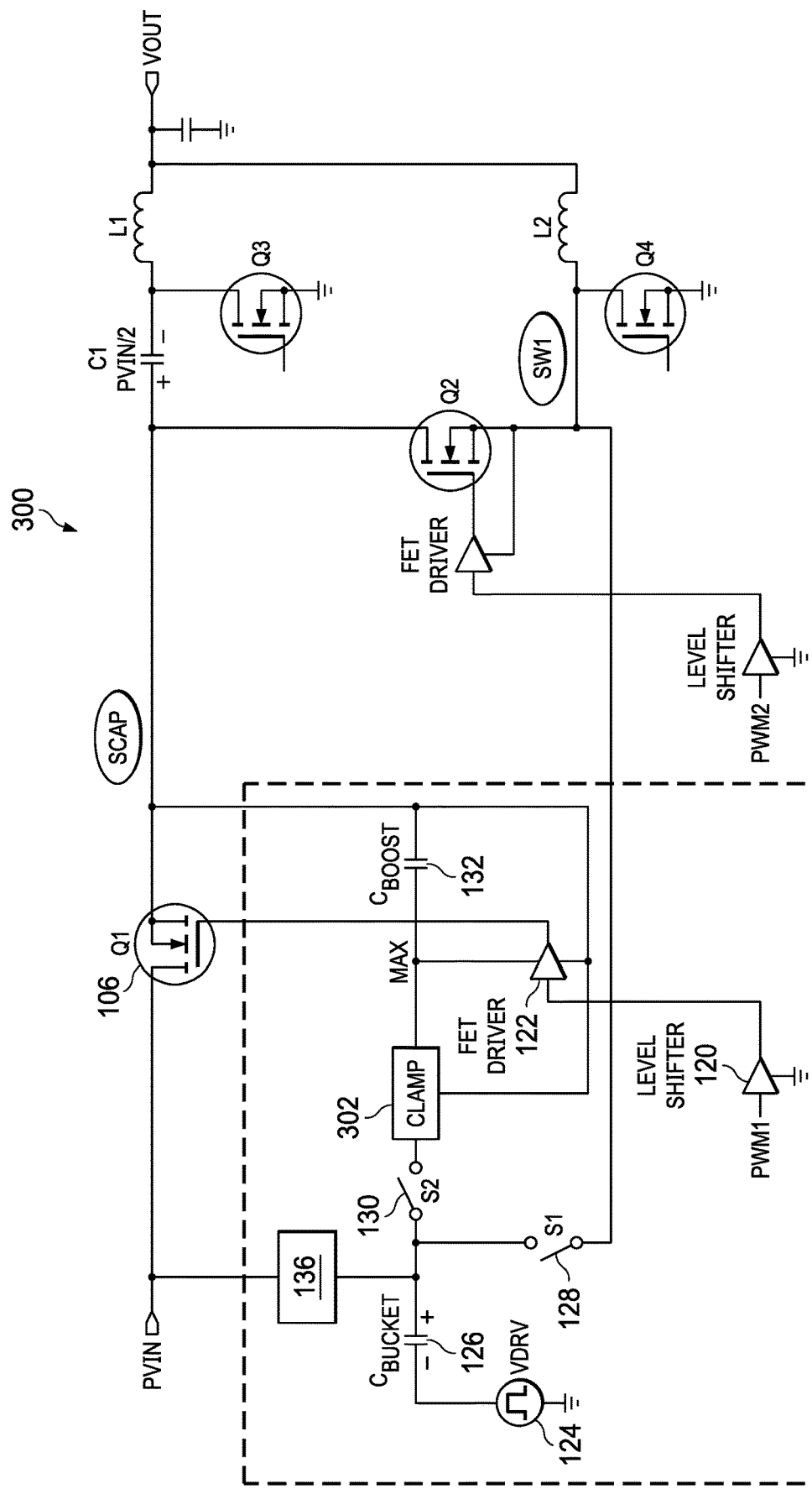
FIG. 3 is an alternative example floating gate driver that may be used with the example power converter of FIG. 1.

FIG. 3 illustrates an alternative example floating gate driver 300 that may be used with the he example power converter 102 of FIG. 1. The example floating gate driver 300 includes the example the example level shifter 120, the example FET driver 122, the example voltage driver 124, the example bucket capacitor ($C_{BUCKET}$) 126, the example switches (S1, S2) 128, 130, and the example boost capacitor ($C_{BOOST}$) 132 of FIG. 1. The alternative example floating gate driver 300 further includes the example voltage clamp 302.

The alternative example floating gate driver 300 of FIG. 3 includes the example voltage clamp 302 to provide local regulation. The example voltage clamp 302 is coupled between the MAX node and the example switch S2 130. Additionally, the example voltage clamp 302 is coupled to the SCAP node. The example voltage clamp 302 ensures that the voltage output at the MAX node is less than the voltage output by the voltage driver 124 (e.g, the voltage seen by the example transistor Q1 106 is VG(Q1)-V(SCAP)). In this manner, the voltage applied between the gate and source terminals of transistor Q1 106 is limited. Limiting the voltage applied to the source and gate terminals of the example transistor Q1 106, ensures that, in a system with multiple floating FETs, the drive voltage for each floating FET is locally regulated to the same value, thereby avoiding circuit malfunctions caused by different FET drops due to differing drive voltage that cause imbalances in the multiple flying capacitors. Additionally, limiting the voltage applied to the source and gate terminals of the Q1 106 prevents device failure by ensuring that the voltage is not too low in systems with sensitive gate voltages (e.g., Gallium Nitride (GaN)).

Figure 4:
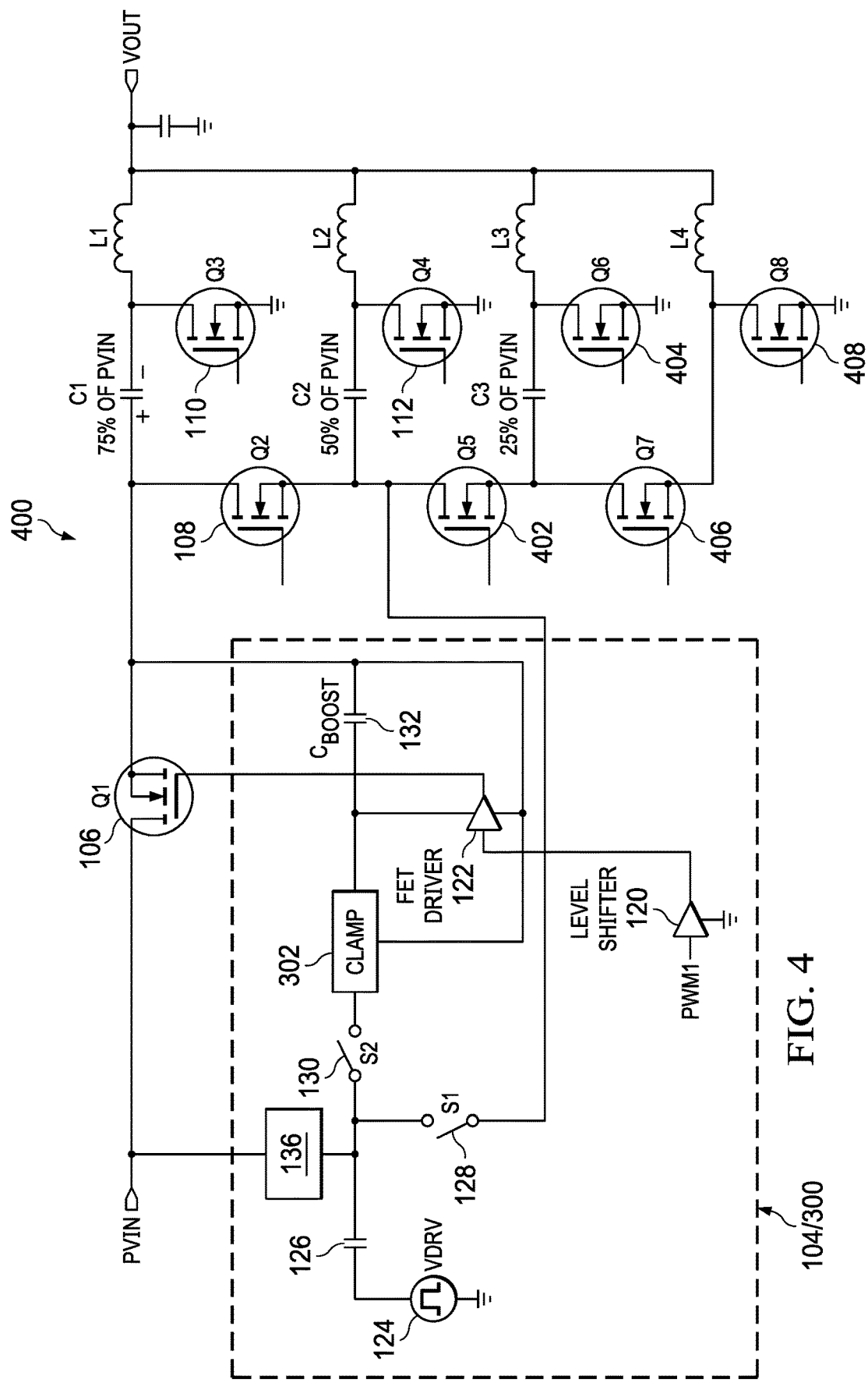
FIG. 4 is an example system including an alternative example power converter and the example floating gate driver of FIGS. 1 and/or 3.

FIG. 4 illustrates an example four-level power converter 400 including the MOSFET Q1 106 driven by the example floating gate driver 104 or the example alternative floating gate driver 300. The example floating gate driver 104, 300 includes the example the example level shifter 120, the example FET driver 122, the example voltage driver 124, the example bucket capacitor ($C_{BUCKET}$) 126, the example switches (S1, S2) 128, 130, the example boost capacitor ($C_{BOOST}$) 132, and the example pre-charger circuit 136 of FIG. 1. When the example alternative floating gate driver 300 is implemented, the voltage clamp 302 of FIG. 3 is included. The example four-level power converter 400 includes example MOSFETs 402, 404, 406, 408.

The example four-tiered power converter 400 of FIG. 4 includes four levels of inductors to generate a desired output voltage. To operate the example four-level converter 400, a PWM signal is used to enable different sets of MOSFETs to charge the different inductors. For example, to charge and discharge the third inductor (L3), the example MOSFET Q2 108 is enabled and the MOSFETS 402, 404 are inversely toggled. Operation of the example floating gate driver 104/300 is substantially similar to the protocol described in conjunction with FIGS. 1 and 3. Additionally, the example driver 104, 300 may be used to drive the example MOSFETS 108, 402.

From the foregoing, it will be appreciated that example methods, apparatus and articles of manufacture have been disclosed to provide a high-efficiency drive for a floating device. The floating gate driver disclosed herein includes two drivers, two capacitors, and two switches. Conventional techniques for driving ungrounded MOSFETs include multiple expensive and efficient components that require many resources, high cost, and large space with a low efficiency. Examples disclosed herein provide a smaller design with less resources to decrease the cost and size of conventional techniques while increasing the efficiency to over 70%.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. An apparatus comprising:
   a driver including a positive supply terminal, an input terminal configured to receive a pulse width modulation (PWM) signal, and an output configured to drive a gate of a high-side transistor in a power converter;
   a first capacitor having a first terminal configured to receive a first voltage from a floating node of the high-side transistor during a first time period, and a second terminal configured to receive a second voltage during a second time period;
   a second capacitor having a first terminal coupled to the positive supply terminal of the driver, and a second terminal coupled to receive the first voltage; and
   a switch circuit configured to decouple the first terminal of the first capacitor from the positive supply terminal of the driver during the first time period, and configured to couple the first terminal of the first capacitor to the positive supply terminal during the second time period.

2. The apparatus of claim 1, wherein the driver includes a negative supply terminal coupled to the second terminal of the second capacitor.

3. The apparatus of claim 1, wherein the second capacitor is configured to boost a supply voltage at the positive supply terminal based on a sum of the first voltage and the second voltage, such that a gate-to-source voltage of the high-side transistor is greater than a threshold voltage of the high-side transistor.

4. The apparatus of claim 1, wherein the switch circuit includes:
   a first switch coupled between the first terminal of the first capacitor and the floating node, the first switch configured to transfer the first voltage to the first terminal of the first capacitor during the first time period; and
   a second switch coupled between the first terminal of the first capacitor and the positive supply terminal of the driver, the second switch configured to transfer the first voltage and the second voltage to the positive supply terminal during the second time period.

5. The apparatus of claim 1, wherein the output of the driver is configured to deliver a driver signal based on the PWM signal and having a relative amplitude greater than the first voltage by the second voltage.

6. The apparatus of claim 1, further comprising:
   a clamp circuit configured to provide voltage regulation to the positive supply terminal.

7. An apparatus comprising:
   a first capacitor including a first terminal, and a second terminal;
   a first switch configured to transfer a first voltage from a source of a transistor to the first terminal during a first time period;
   a first driver configured to apply a second voltage to the second terminal during a second time period after the first time period;
   a second capacitor including a third terminal, and a fourth terminal coupled to receive the first voltage from the source;
   a second switch configured to connect the first terminal to the third terminal during the second time period; and
   a second driver including a positive supply terminal coupled to the third terminal, a negative supply terminal coupled to the fourth terminal, and a driver output configured to drive a gate of the transistor.

8. The apparatus of claim 7, further comprising:
a controller configured to close the first switches and open the second switch during the first time period, and configured to open the first switch and close the second switch during the second time period after the first time period.

9. The apparatus of claim 7, wherein the first switch is coupled between the first terminal of the first capacitor and a floating node of a flying capacitor buck converter.

10. The apparatus of claim 7, wherein the second switch is configured to disconnect the first terminal from the third terminal during the first time period before the second time period.

11. The apparatus of claim 8, wherein the first switch includes a diode having an anode configured to receive the first voltage and a cathode coupled to the first terminal.

12. The apparatus of claim 7, wherein the second switch includes a diode having an anode coupled to the first terminal and a cathode coupled to the third terminal.

13. The apparatus of claim 7, wherein the source of the transistor is configured to float during the first time period and the second time period.

14. The apparatus of claim 7, wherein the second driver is configured to drive the gate of the transistor with a driving voltage that is greater than the first voltage by the second voltage.

15. The apparatus of claim 7, wherein the first driver is configured to apply a zero voltage relative to the first voltage to the second terminal during the first time period before the first time period.

16. A power converter comprising:
a high-side transistor having a drain coupled to a voltage input terminal, a gate, and a source;
a flying capacitor having a first terminal coupled to the source of the high-side transistor, and a second terminal;
a low-side transistor having a drain coupled to the second terminal of the flying capacitor, and a source coupled to a ground terminal; and
a gate driver configured to drive the gate of the high-side transistor, the gate driver including:
a positive supply terminal;
a first capacitor including a first terminal configured to receive a first voltage from the source of the high-side transistor during a first time period, and a second terminal configured to receive a second voltage during a second time period after the first period;
a second capacitor including including a first terminal coupled to the positive supply terminal of the driver, and a second terminal coupled to the source of the high-side transistor; and
a switch circuit configured to decouple the first terminal of the first capacitor from the positive supply terminal during the first time period, and configured to couple the first terminal of the first capacitor to the positive supply terminal during the second time period.

17. The system of claim 16, wherein source of the high-side transistor is configured to float during the first time period and the second time period.

18. The system of claim 17, wherein the switch circuit includes:
a first switch coupled between the first terminal of the first capacitor and the floating source, the first switch configured to transfer the first voltage to the first terminal of the first capacitor during the first time period; and
a second switch coupled between the first terminal of the first capacitor and the positive supply terminal, the second switch configured to transfer the first voltage and the second voltage to the positive supply terminal during the second time period.

19. The system of claim 16, wherein the gate driver is configured to drive the gate of the transistor with a driving voltage that is greater than the first voltage by the second voltage.

* * * * *